US010998881B2

(12) United States Patent
Nomoto et al.

(10) Patent No.: US 10,998,881 B2
(45) Date of Patent: May 4, 2021

(54) COMPOSITE SUBSTRATE, METHOD FOR PRODUCING THE SAME, AND ELECTRONIC DEVICE

(71) Applicant: NGK INSULATORS, LTD., Nagoya (JP)

(72) Inventors: Yuki Nomoto, Nagoya (JP); Kei Tanaka, Inazawa (JP); Katsuhiro Inoue, Ama-Gun (JP); Yuji Katsuda, Tsushima (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 16/296,812

(22) Filed: Mar. 8, 2019

(65) Prior Publication Data
US 2019/0207585 A1 Jul. 4, 2019

Related U.S. Application Data

(63) Continuation of application No. PCT/JP2017/033454, filed on Sep. 15, 2017.

(30) Foreign Application Priority Data

Sep. 20, 2016 (WO) ............... PCT/JP2016/077628

(51) Int. Cl.
H03H 9/25 (2006.01)
H03H 3/10 (2006.01)
H03H 9/02 (2006.01)
B32B 38/00 (2006.01)
B28B 3/00 (2006.01)
B28B 7/34 (2006.01)
B32B 18/00 (2006.01)
(Continued)

(52) U.S. Cl.
CPC ............ *H03H 9/25* (2013.01); *B28B 3/00* (2013.01); *B28B 7/34* (2013.01); *B28B 11/0845* (2013.01);
(Continued)

(58) Field of Classification Search
CPC ...... H03H 9/25; H03H 9/058; H03H 9/02574; H03H 9/02622; H03H 9/02834;
(Continued)

(56) References Cited

U.S. PATENT DOCUMENTS 8,866,365 B2 * 10/2014 Hori ................. H03H 3/02
310/313 R
2005/0194864 A1 * 9/2005 Miura ............... H03H 9/02559
310/313 R
(Continued)

FOREIGN PATENT DOCUMENTS

JP H02-187177 A1 7/1990
JP H05-124867 A 5/1993
(Continued)

OTHER PUBLICATIONS

"Direct bonding of two crystal substrates at room temperature by Ar—beam surface activation", Takagi et al., Journal of Crystal Growth, vol. 292, pp. 429-432, May 26, 2006 (Takagi) (Year: 2006).*
(Continued)

Primary Examiner — Daniel J. Schleis
Assistant Examiner — Kevin C T Li
(74) Attorney, Agent, or Firm — Burr & Brown, PLLC

(57) ABSTRACT

A composite substrate includes a supporting substrate and a functional substrate that are directly joined together, the supporting substrate being a sintered sialon body.

8 Claims, 1 Drawing Sheet

(51) Int. Cl.
*B32B 37/10* (2006.01)
*B32B 37/18* (2006.01)
*B28B 11/08* (2006.01)
*C04B 37/00* (2006.01)
*H03H 9/05* (2006.01)

(52) U.S. Cl.
CPC .............. *B32B 18/00* (2013.01); *B32B 37/10* (2013.01); *B32B 37/18* (2013.01); *B32B 38/0012* (2013.01); *C04B 37/001* (2013.01); *C04B 37/003* (2013.01); *H03H 3/10* (2013.01); *H03H 9/02574* (2013.01); *H03H 9/02622* (2013.01); *H03H 9/058* (2013.01); *B32B 2250/02* (2013.01); *B32B 2305/80* (2013.01); *B32B 2307/10* (2013.01); *B32B 2307/20* (2013.01); *B32B 2307/538* (2013.01); *B32B 2307/546* (2013.01); *B32B 2307/72* (2013.01); *B32B 2310/0875* (2013.01); *B32B 2315/02* (2013.01); *B32B 2457/00* (2013.01); *C04B 2237/341* (2013.01); *C04B 2237/345* (2013.01); *C04B 2237/52* (2013.01); *C04B 2237/708* (2013.01)

(58) Field of Classification Search
CPC .... H03H 9/02566; H03H 3/10; C04B 37/003; C04B 37/001; C04B 2237/708; C04B 2237/345; C04B 2237/341; C04B 2237/52; B28B 11/0845; B28B 7/34; B28B 3/00; B32B 37/18; B32B 37/10; B32B 2310/0875; B32B 2307/546; B32B 2307/72; B32B 2307/10; B32B 2307/20; B32B 2307/538; B32B 38/0012; B32B 18/00; B32B 2457/00; B32B 2315/02; B32B 2305/80; B32B 2250/02
See application file for complete search history.

(56) References Cited

U.S. PATENT DOCUMENTS

| | | |
|---|---|---|
| 2008/0252394 A1 | 10/2008 | Tajima et al. |
| 2009/0236935 A1 | 9/2009 | Kando |
| 2012/0086312 A1 | 4/2012 | Kobayashi et al. |
| 2017/0221786 A1 | 8/2017 | Konishi et al. |

FOREIGN PATENT DOCUMENTS

| | | | |
|---|---|---|---|
| JP | H08-130439 A1 | 5/1996 | |
| JP | 2004-241670 A1 | 8/2004 | |
| JP | 2005-252550 A | 9/2005 | |
| JP | 2007-214902 A | 8/2007 | |
| JP | 2008-270904 A1 | 11/2008 | |
| JP | 2009-248398 A | 10/2009 | |
| JP | 2012-085286 A1 | 4/2012 | |
| JP | 2015-023193 A1 | 2/2015 | |
| JP | 2015023193 A * | 2/2015 | |
| JP | 5874738 B2 | 3/2016 | |
| JP | 2016072450 A * | 5/2016 | ............ H01L 27/12 |
| JP | 2016-144829 A | 8/2016 | |
| KR | 10-2008-0093370 A | 10/2008 | |
| WO | 2008/078481 A1 | 7/2008 | |
| WO | 2014/027538 A1 | 2/2014 | |
| WO | 2016/052597 A1 | 4/2016 | |

OTHER PUBLICATIONS

Temperature Compensated LiTaO3/Sapphire Bonded SAW Substrate with Low Loss and High Coupling Factor Suitable for US-PCS Application, Ueda et al., 2004 IEEE Ultrasonics Symposium, pp. 1322-1325, 2004, https://ieeexplore.ieee.org/stamp/stamp.jsp?tp=&arnumber=1418036 (Ueda) (Year: 2004).*
"Sialon Engineering Properties", Accuratus, Feb. 9, 2005, https://web.archive.org/web/20050209180536/https://www.accuratus.com/sialon.html (Accuratus) (Year: 2005).*
English translation of International Preliminary Report on Patentability (Chapter I) (Application No. PCT/JP2017/033454) dated Apr. 4, 2019, 9 pages.
Japanese Office Action (with English translation), Japanese Application No. 2018-502194, dated Aug. 6, 2019 (10 pages).
International Search Report and Written Opinion (Application No. PCT/JP2017/033454) dated Dec. 5, 2017.
Japanese Office Action (Application No. 2018-502194) dated Jan. 26, 2019.
Korean Office Action (with English translation), Korean Application No. 10-2019-7007042, dated May 28, 2020 (12 pages).

* cited by examiner

COMPOSITE SUBSTRATE, METHOD FOR PRODUCING THE SAME, AND ELECTRONIC DEVICE

BACKGROUND OF THE INVENTION

1. Field of the Invention

The present invention relates to a composite substrate, a method for producing the composite substrate, and an electronic device.

2. Description of the Related Art

Surface acoustic wave devices are used, for example, as bandpass filters in communication equipment such as cellular phones. A piezoelectric substrate, which is a surface acoustic wave device, is required to have a high acoustic velocity and a large electromechanical coupling coefficient, and thus lithium niobate (LN) and lithium tantalate (LT), which satisfy this requirement, have been widely used. However, LT and LN have high coefficients of thermal expansion and expand and contract greatly with changes in ambient temperature. This causes a filter to have a shifted center frequency and pass a narrower range of frequencies, leading to deterioration of characteristics. Thus, surface acoustic wave devices have been required to be less likely to expand and contract with changes in ambient temperature. To achieve this, composite substrates have been developed that include a supporting substrate having a high Young's modulus and a relatively low coefficient of thermal expansion and a thin piezoelectric substrate joined to the supporting substrate. With this configuration, the piezoelectric substrate is held by the supporting substrate and does not expand or contract. For example, PTL 1 discloses a composite substrate including a piezoelectric substrate and a supporting substrate that are joined together with an adhesive layer interposed therebetween. Sapphire, silicon, alumina, etc. are given as examples of materials of the supporting substrate. These materials have lower coefficients of thermal expansion than the piezoelectric substrate and thus can reduce the temperature dependence of frequency. In addition, these materials have high acoustic velocities and thus are suitable for high-frequency surface acoustic wave devices.

PTL 2 discloses a method for manufacturing a composite substrate by performing a coating treatment by, for example, CVD on a supporting substrate to form a 0.1 to 10 μm amorphous layer and then bonding together the supporting substrate and a single crystal semiconductor substrate with the amorphous layer interposed therebetween. Sialon, etc. are given as examples of materials of the supporting substrate.

CITATION LIST

Patent Literature

PTL 1: JP 2012-85286 A
PTL 2: WO 2016/052597 A1

SUMMARY OF THE INVENTION

However, although sapphire and alumina in PTL 1 have lower coefficients of thermal expansion than the piezoelectric substrate, their coefficients are about 7 ppm/K, and thus sapphire and alumina have a problem in that they cannot significantly reduce the temperature dependence of frequency. Sapphire also has a problem in that it has an excessively high Young's modulus of 450 GPa or more and hence poor workability. Silicon has problems in that although having a sufficiently lower coefficient of thermal expansion than the piezoelectric substrate, silicon has a low Young's modulus of about 180 to 190 GPa and thus may cause curling or cracking, and in that silicon has a resistivity on the order of $10^4$ Ωcm at most and has insufficient insulation properties, thus deteriorating resonance characteristics of a filter. Thus, there has been a need for a supporting substrate having a high acoustic velocity, high insulation properties, a moderate Young's modulus, and a sufficiently low coefficient of thermal expansion. In addition, the composite substrate disclosed in PTL 1 has a problem in that due to the presence of the adhesive layer, such as an organic adhesive layer, between the piezoelectric substrate and the supporting substrate, the entire composite substrate has an excessively low Young's modulus, and the supporting substrate cannot sufficiently exert the power to hold the piezoelectric substrate.

In PTL 2, sialon is given as an example of a material of the supporting substrate. However, the composite substrate disclosed in PTL 2 has a problem in that due to the presence of the 0.1 to 10 μm amorphous layer having a low Young's modulus between the supporting substrate and the single crystal semiconductor substrate, the entire composite substrate has an excessively low Young's modulus, and the supporting substrate cannot sufficiently exert the power to hold the piezoelectric substrate.

The present invention has been made to solve these problems, and it is a primary object thereof to provide a composite substrate suitable as a material for a high-frequency acoustic wave device.

A composite substrate of the present invention is a composite substrate including a supporting substrate and a functional substrate that are directly joined together. The supporting substrate is a sintered sialon body. The sintered sialon body has a high acoustic velocity, and thus an acoustic wave device including the composite substrate of the present invention can be used at higher frequencies. The sintered sialon body has a moderate Young's modulus, and thus the composite substrate of the present invention is less prone to curling and cracking and has good workability at the same time. Furthermore, the sintered sialon body has a high resistivity and high insulation properties, and thus an acoustic wave device including the composite substrate of the present invention will have good resonance characteristics. Furthermore, the sintered sialon body has a sufficiently low coefficient of thermal expansion, and thus an acoustic wave device including the composite substrate of the present invention can have a sufficiently reduced temperature dependence of frequency. In addition, since the supporting substrate and the functional substrate are integrated together by direct joining, the Young's modulus of the entire composite substrate cannot be excessively low, and the supporting substrate can sufficiently exert the power to hold the functional substrate, as compared to when the substrates are integrated together, for example, via an adhesive layer.

A method for producing a composite substrate of the present invention is a method for producing the composite substrate described above. The method includes a joining step of directly joining together a surface of the supporting substrate and a surface of the functional substrate. Before the joining step, any of the following is performed: (a) the surface of the supporting substrate is finished by polishing such that the number of pores present on the surface of the supporting substrate is 30 or less per 100 μm×100 μm area, (b) the surface of the supporting substrate is finished by polishing such that the center-line average roughness (Ra) of the surface of the supporting substrate in a 100 μm×140 μm measurement area is 1 nm or less, and (c) the surface of the supporting substrate is finished by polishing such that the level difference (Pt) between a maximum peak height and a maximum valley depth of a primary profile of the surface of the supporting substrate in a 100 μm×140 μm measurement area is 30 nm or less. In this method, the sintered sialon body is used as the supporting substrate, and thus the surface of the supporting substrate finished by polishing has high surface flatness. Therefore, the method is suitable for directly joining together the functional substrate and the supporting substrate.

An electronic device of the present invention includes the above-described composite substrate of the present invention. The sintered sialon body constituting the supporting substrate of the electronic device has a high acoustic velocity, a moderate Young's modulus, a high resistivity, and a sufficiently low coefficient of thermal expansion. Thus, the electronic device can be used at higher frequencies, is less prone to curling and cracking and has good workability at the same time, has good resonance characteristics, and can have a sufficiently reduced temperature dependence of frequency.

DETAILED DESCRIPTION OF THE INVENTION

Figure 1:
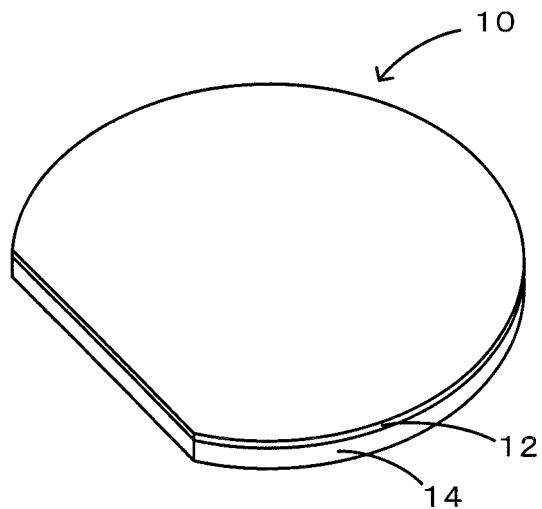
FIG. 1 is a perspective view of a composite substrate 10.

It should be understood that while embodiments of the present invention will be specifically described below, the present invention is not limited to the following embodiments, and appropriate modifications and variations can be made without departing from the spirit of the present invention on the basis of the general knowledge of one skilled in the art.

A composite substrate according to an embodiment is a composite substrate including a supporting substrate and a functional substrate that are directly joined together. The supporting substrate is a sintered sialon body. The sintered sialon body is represented by general formula: $Si_{6-z}Al_zO_zN_{8-z}$ ($0<z\leq4.2$) and may contain a metal oxide such as magnesium oxide or yttrium oxide to form a solid solution. Examples of the functional substrate include, but are not limited to, LT, LN, gallium nitride, and silicon. Of these, LT and LN are preferred. An amorphous layer having a thickness of 5 nm or less may be present at the interface between the supporting substrate and the functional substrate.

The sintered sialon body has a high acoustic velocity. Thus, an acoustic wave device including the composite substrate according to this embodiment can be used at higher frequencies. The acoustic velocity of the sintered sialon body is preferably 5000 m/s or more, more preferably 5500 m/s or more. The acoustic velocity of sialon depends on shear modulus, density, Young's modulus, and Poisson's ratio, and these properties can be controlled by adjusting the value of z in the above formula.

The sintered sialon body has a moderate Young's modulus. In other words, the composite substrate according to this embodiment is moderately hard, and thus is less prone to curling and cracking and also has good workability. The Young's modulus of the sintered sialon body is preferably 200 GPa or more and 350 GPa or less.

The sintered sialon body has a high resistivity and high insulation properties. Thus, an acoustic wave device including the composite substrate according to this embodiment will have good resonance characteristics. The resistivity of the sintered sialon body is preferably $10^{14}$ Ωcm or more.

The sintered sialon body has a coefficient of thermal expansion sufficiently lower than that of the functional substrate. Thus, an acoustic wave device including the composite substrate according to this embodiment can have a sufficiently reduced temperature dependence of frequency. The coefficient of thermal expansion (40° C. to 400° C.) of the sintered sialon body is preferably 3.0 ppm/K or less, more preferably 2.7 ppm/K or less.

Preferably, the sintered sialon body has an open porosity of 0.1% or less and a relative density of 99.9% or more. In an X-ray diffraction pattern of the sintered sialon body, the ratio of the sum total of the intensities of maximum peaks of components other than sialon to the intensity of a maximum peak of sialon is preferably 0.005 or less. The X-ray diffraction pattern is measured under the conditions of CuKα, 40 kV, 40 mA, and 2θ=10° to 70°.

Next, a method for producing a sintered sialon body will be described. The procedure for producing a sintered sialon body includes a step of preparing a raw sialon powder and a step of producing a sintered sialon body.

(Preparation of Raw Sialon Powder)

For a raw powder, commercially available silicon nitride, aluminum nitride, alumina, and silica powders each having an elemental metal impurity content of 0.2 mass % or less and an average particle size of 2 μm or less are used. Using these raw materials, their mass ratio is determined such that Si:Al:O:N=(6-z):z:z:(8-z) ($0<z\leq4.2$) is a predetermined composition, and the components are mixed to prepare a raw sialon powder. The value of z is preferably $0.5\leq z\leq4.0$. For dense sintering, each powder is more preferably fine and has an average particle size of 1.5 μm or less, still more preferably 1 μm or less. The raw powder may be mixed by any method. For example, a ball mill, an attritor, a bead mill, or a jet mill may be used, and either a dry method or a wet method may be used. To obtain a homogeneously mixed raw powder, a wet method using a solvent is preferred. In this case, the solvent used for the mixing is dried off to obtain a raw powder. The raw powder may contain additives. Examples of additives include magnesium oxide and yttrium oxide. The slurry obtained is dried, and the dried product is sifted to prepare a raw sialon powder. If the composition is changed due to contamination, for example, with medium components during the mixing, the composition may be appropriately adjusted to prepare a raw powder. Alternatively, the masses of the components of the mixed powder may be adjusted in advance such that the masses of the components of the mixture provide the desired sialon composition, thus allowing the mixture to be directly used as a raw sialon powder.

(Production of Sintered Sialon Body)

The raw sialon powder obtained is formed into a predetermined shape. The formation may be performed by any method, and a commonly-used forming method may be used. For example, the raw sialon powder as described above may be directly press-formed using a mold. When press-forming is used, the raw sialon powder may be granulated by spray drying to improve formability. Alternatively, a green body prepared by adding an organic binder may be extrusion-molded, or a slurry prepared by adding an organic binder may be sheet-formed. In these processes, the organic binder component needs to be removed before or during a firing step. Alternatively, high-pressure molding may be performed by cold isostatic pressing (CIP).

Next, the resulting formed product is fired to produce a sintered sialon body. In this step, it is preferable to keep sintered grains fine and remove pores during sintering in order to improve the surface flatness of the sintered sialon body. Hot pressing is very effective in achieving this. Hot pressing allows densification to proceed with grains kept fine at a lower temperature than in pressureless sintering and can prevent coarse pores, which are often observed in pressureless sintering, from being left behind. The firing temperature during hot pressing is preferably 1725° C. to 1900° C., more preferably 1750° C. to 1900° C. The pressure during hot pressing is preferably 100 to 300 kgf/cm$^2$, more preferably 150 to 250 kgf/cm$^2$. The holding time at the firing temperature (maximum temperature) may be appropriately selected in view of the shape and size of the formed product, the characteristics of a heating furnace, etc. Specifically, for example, the holding time is preferably 1 to 12 hours, more preferably 2 to 8 hours. The firing atmosphere during hot pressing is preferably a nitrogen atmosphere to avoid decomposition of sialon.

Next, a method for producing a composite substrate will be described. The method preferably includes a step of joining together a surface of the supporting substrate made of the sintered sialon body described above and a surface of the functional substrate by direct joining. The area percentage (joining area percentage) of an actually joining portion of the joint interface is preferably 80% or more, more preferably 90% or more. Such a high joining area percentage provides a good composite substrate in which the functional substrate and the supporting substrate are firmly joined together.

In direct joining, surfaces to be joined of the functional substrate and the supporting substrate are activated, and the substrates are then pressed with the surfaces to be joined facing each other. The activation of the surfaces to be joined is performed, for example, by irradiation of the surfaces to be joined with a neutral atomic beam of an inert gas (e.g., argon), a plasma beam, or an ion beam. The irradiation can be performed, for example, by using an ion gun or a FAB gun. The FAB gun has greater energy per particle than the ion gun and more effectively removes oxide films and adsorbed layers, which may impede cold joining, on the substrate surfaces. That is, the FAB gun is more preferred because free bonds necessary for joining are easily created. Before the functional substrate and the supporting substrate are directly joined together, any of the following is preferably performed: (a) the surface of the supporting substrate is finished by polishing such that the number of pores present on the surface of the supporting substrate is 30 or less per 100 μm×100 μm area, (b) the surface of the supporting substrate is finished by polishing such that the center-line average roughness (Ra) of the surface of the supporting substrate in a 100 μm×140 μm measurement area is 1 nm or less, and (c) the surface of the supporting substrate is finished by polishing such that the level difference (Pt) between a maximum peak height and a maximum valley depth of a primary profile of the surface of the supporting substrate in a 100 μm×140 μm measurement area is 30 nm or less. This increases the area of contact at nano-level between the functional substrate and the supporting substrate and enables successful direct joining. For example, the joining area percentage may be 80% or more (preferably 90% or more). The number of pores in (a) above is more preferably 10 or less. Ra in (b) above is more preferably 0.9 nm or less. Pt in (c) above is more preferably 27 nm or less. The finishing by polishing of the surface of the supporting substrate is preferably performed such that at least one of (a) to (c) is satisfied. As with the surface of the supporting substrate, the surface of the functional substrate is preferably finished by polishing such that at least one of (a) to (c) is satisfied. FIG. 1 illustrates an example of a composite substrate. A composite substrate 10 includes a piezoelectric substrate 12, which is a functional substrate, and a supporting substrate 14 that are joined together by direct joining.

Since the composite substrate thus produced is produced by direct joining, as compared to when produced by joining via an adhesive layer, the Young's modulus of the entire composite substrate cannot be excessively low, and the temperature dependence of frequency can be reduced because the power of the supporting substrate to hold the functional substrate is strong. The composite substrate thus produced may include an amorphous layer having a thickness of 5 nm or less at the interface between the supporting substrate and the functional substrate. If such a very thin amorphous layer is present between the supporting substrate and the functional substrate, the Young's modulus of the entire composite substrate cannot be excessively low, and the supporting substrate can sufficiently exert the power to hold the functional substrate.

Figure 2:
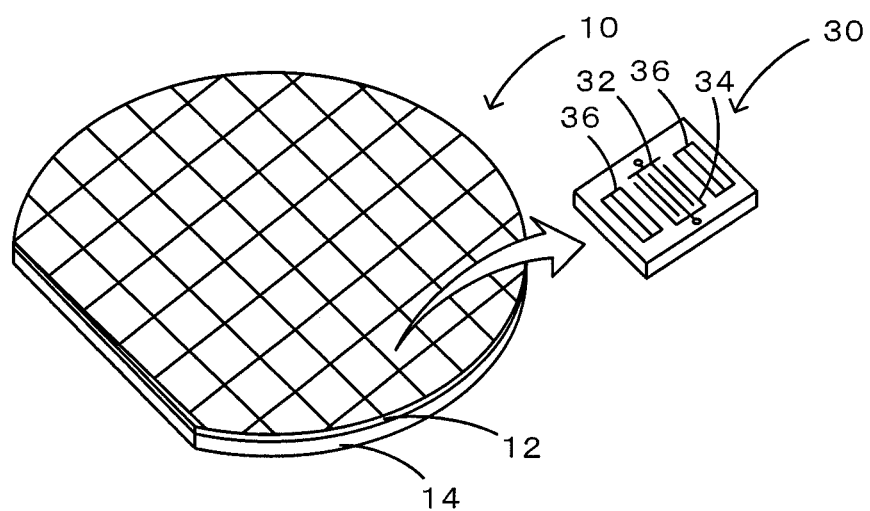
FIG. 2 is a perspective view of an electronic device 30 produced using the composite substrate 10.

Next, an embodiment of an electronic device will be described. The electronic device includes the composite substrate described above. In the composite substrate used for the electronic device, the thickness ratio of the functional substrate to the supporting substrate (thickness of functional substrate/thickness of supporting substrate) is preferably 0.1 or less. Examples of the electronic device include acoustic wave devices (e.g., surface acoustic wave devices, Lamb wave devices, and film bulk acoustic resonators (FBARs)), LED devices, optical waveguide devices, and switching devices. When the composite substrate described above is used for an acoustic wave device, the power of the supporting substrate to hold the functional substrate is enhanced because the sintered sialon body constituting the supporting substrate has a very low coefficient of thermal expansion and a high Young's modulus. As a result, the temperature dependence of frequency of the device is greatly improved. FIG. 2 illustrates an example of an electronic device 30 produced using a composite substrate 10. The electronic device 30 is a one-port SAW resonator, that is, a surface acoustic wave device. First, a pattern of a large number of electronic devices 30 is formed on a piezoelectric substrate 12 of a composite substrate 10 by using a common photolithographic technique, and the composite substrate 10 is then cut by dicing into separate electronic devices 30. Each of the electronic devices 30 has a structure in which interdigital transducer (IDT) electrodes 32 and 34 and reflecting electrodes 36 are formed on a surface of the piezoelectric substrate 12 by the photolithographic technique.

EXAMPLES

Examples of the present invention will be described below. The following examples are not intended to limit the present invention.

1. Preparation of Raw Powder

For a raw powder, a silicon nitride powder (oxygen content: 1.3 mass %, elemental metal impurity content: 0.2 mass % or less, average particle size: 0.6 μm) and powders of aluminum nitride (oxygen content: 0.8 mass %, elemental metal impurity content: 0.1 mass % or less, average particle size: 1.1 µm), alumina (purity: 99.9 mass %, average particle size: 0.5 µm), and silica (purity: 99.9 mass %, average particle size: 0.5 µm), the powders being commercially available, were used.

Raw sialon powders A to K were prepared in the following manner. Specifically, first, the powders of aluminum nitride, alumina, silicon nitride, and silica were each weighed so as to provide a sialon composition ($Si_{6-z}Al_zO_zN_{8-z}$) having a z value shown in Table 1. These powders were mixed for 4 hours in a ball mill using alumina balls (5 mm in diameter) and isopropyl alcohol as a solvent, to thereby prepare a sialon mixture (a slurry of the mixed powders). The slurry obtained was dried at 110° C. under a stream of nitrogen gas, and the dried product is sifted to obtain the raw sialon powders A to K. The raw sialon powders D, H, and K were prepared according to this procedure with magnesium oxide (purity: 99.9%, average particle size: 1.8 µm) added, and the raw sialon powders E, F, G, I, and J with yttrium oxide (purity: 99.9%, average particle size: 1.1 µm) added.

TABLE 1

| | | Raw Composition | | | | | |
|---|---|---|---|---|---|---|---|
| Raw Sialon Powder | Value of z | AlN (mass %) | $Al_2O_3$ (mass %) | $Si_3N_4$ (mass %) | $SiO_2$ (mass %) | MgO (mass %) | $Y_2O_3$ (mass %) |
| A | 0.5 | 7.3 | 0.0 | 87.3 | 5.3 | 0.0 | 0.0 |
| B | 2.5 | 36.2 | 0.0 | 37.2 | 26.6 | 0.0 | 0.0 |
| C | 4.0 | 57.7 | 0.0 | 0.0 | 42.3 | 0.0 | 0.0 |
| D | 2.5 | 35.5 | 0.0 | 36.5 | 26.0 | 2.0 | 0.0 |
| E | 2.5 | 35.1 | 0.0 | 36.1 | 25.8 | 0.0 | 3.0 |
| F | 1.0 | 34.4 | 0.0 | 35.4 | 25.2 | 0.0 | 5.0 |
| G | 0.5 | 7.1 | 0.0 | 84.8 | 5.1 | 0.0 | 3.0 |
| H | 0.5 | 7.2 | 0.0 | 86.5 | 5.3 | 1.0 | 0.0 |
| I | 0.5 | 7.3 | 0.0 | 86.9 | 5.3 | 0.0 | 0.5 |
| J | 1.0 | 35.1 | 0.0 | 36.2 | 25.7 | 0.0 | 3.0 |
| K | 1.0 | 35.8 | 0.0 | 36.9 | 26.3 | 1.0 | 0.0 |

2. Production and Evaluation of Sintered Body (1) Experimental Example 1

A sintered sialon body of Experimental Example 1 was prepared by forming the raw sialon powder A to be 125 mm in diameter and about 20 mm in thickness by using a mold and then hot-press firing the formed product in a graphite mold at a pressure of 200 kgf/cm² and a maximum temperature of 1800° C. for 4 hours. The firing atmosphere was a nitrogen atmosphere. The sintered body obtained was 125 mm in diameter and about 8 mm in thickness. Test pieces such as a flexural bar having dimensions of 4 mm×3 mm×40 mm were cut out of the sintered body and evaluated for various properties. Methods for evaluating the various properties are described below. The results are shown in Table 2. The surface properties of the sintered body were evaluated using a test piece of about 4 mm×3 mm×10 mm with its one surface mirror-finished by polishing. The polishing was performed by lap-polishing with 3 µm diamond abrasive grains and, as a finish, with 0.5 µm diamond abrasive grains.

Bulk Density and Open Porosity

The measurement was carried out by the Archimedes' method using distilled water.

Relative Density

Relative density was calculated as bulk density/apparent density.

Crystal Phase and Peak Intensity Ratio Ix

The sintered sialon body was pulverized. Using an X-ray diffractometer, sialon and different phases were identified, and the intensity of a maximum peak of each phase was calculated. If the sintered body is pulverized for a long period of time, care should be taken because the sintered body may be contaminated with alumina from an alumina mortar used. The X-ray diffractometer used was a D8 ADVANCE fully automatic multi-purpose X-ray analyzer, and the measurement conditions were CuKα, 40 kV, 40 mA, and 2θ=10°–70°. From an X-ray diffraction pattern, the ratio (peak intensity ratio Ix) of the sum total of the intensities (Ip, Iq, Ir, . . . ) of maximum peaks of the different phases detected (P, Q, R, . . . ) to the intensity (Ic) of a maximum peak (2θ=32.8° to 33.5°) of sialon was determined by the following formula. When a maximum peak overlapped another peak, a peak having the second highest peak intensity was used instead of the maximum peak.

$Ix=(Ip+Iq+Ir \ldots )/Ic$

Average Grain Size of Sintered Sialon Grains

Sintered sialon grains in a fractured section were observed with a SEM in a field of view of 127 µm×88 µm. The grain size of 10 or more sintered sialon grains in the field of view was determined, and the average was calculated to determine the average grain size of the sintered sialon grains. The grain size of one sintered sialon grain was defined as the average of lengths of the major axis and the minor axis of the sintered grain.

Number of Pores

The surface mirror-finished as described above was observed with a 3D measurement laser microscope. The number of pores having a maximum length of 0.5 µm or more and a depth of 0.08 µm or more per unit area was counted at four areas, and the average was calculated to determine the number of pores. The unit area was a 100 µm square area.

Surface Flatness

Using a three-dimensional optical profiler (Zygo), the surface mirror-finished as described above was measured to determine its center-line average roughness Ra and its level difference Pt between maximum peak height and maximum valley depth. Ra and Pt in this description respectively correspond to the arithmetic average roughness Ra of a primary profile and the total height Pt of the primary profile specified in JIS B 0601:2013. Ra and Pt were used to evaluate surface flatness. The measurement area was 100 µm×140 µm.

Young's Modulus

The measurement was carried out by a static deflection method in accordance with JIS R1602. The test piece shape was a 3 mm×4 mm×40 mm flexural bar.

Coefficient of Thermal Expansion (CTE, 40° C. to 400° C.)

The measurement was carried out by a push-rod differential method in accordance with JIS R1618. The test piece shape was 3 mm×4 mm×20 mm.

Acoustic Velocity

Acoustic velocity c was calculated by the following formula. Poisson's ratio was measured using a test piece with a strain gage attached thereto.

$c=(G/\rho)^{1/2}, G=E/2(1+\nu)$ (G: shear modulus, ρ: density, E: Young's modulus, ν: Poisson's ratio)

TABLE 2

| Experimental Example | Producing Condition | | | Property of Sintered Body | | | | |
|---|---|---|---|---|---|---|---|---|
| | Raw Powder | Firing Temperature (° C.) | Value of z | Bulk Density (g/cm³) | Apparent Density (g/cm³) | Open porosity (%) | Relative Density (%) | Phase Other Than Sialon |
| 1 | A | 1800 | 0.5 | 3.160 | 3.160 | 0.00 | 100.00 | $Al_2O_3$, $Si_2ON_2$ |
| 2 | B | 1800 | 2.5 | 3.091 | 3.092 | 0.00 | 99.97 | $Al_2O_3$ |
| 3 | C | 1800 | 4.0 | 3.041 | 3.042 | 0.00 | 99.97 | $Al_2O_3$ |
| 4 | D | 1800 | 2.5 | 3.090 | 3.090 | 0.00 | 100.00 | $Al_2O_3$ |
| 5 | E | 1800 | 2.5 | 3.122 | 3.122 | 0.01 | 100.00 | $Al_2O_3$ |
| 6 | F | 1800 | 1.0 | 3.203 | 3.204 | 0.01 | 99.97 | $Al_2O_3$ |
| 7 | G | 1700 | 0.5 | 3.207 | 3.207 | 0.01 | 100.00 | $Al_2O_3$ |
| 8 | H | 1700 | 0.5 | 3.167 | 3.168 | 0.01 | 99.97 | $Al_2O_3$ |
| 9 | I | 1700 | 0.5 | 3.172 | 3.173 | 0.01 | 99.97 | $Al_2O_3$ |
| 10 | J | 1700 | 1.0 | 3.181 | 3.181 | 0.01 | 100.00 | $Al_2O_3$ |
| 11 | K | 1700 | 1.0 | 3.147 | 3.147 | 0.00 | 100.00 | $Al_2O_3$ |

| Property of Sintered Body | | | | | | | | |
|---|---|---|---|---|---|---|---|---|
| Peak Intensity Ratio Ix | Agerage Grain Size of Sialon (μm) | Number of Pore (number) | Ra (nm) | Pt (nm) | Resistivity (Ω·cm) | Young's Modulus (GPa) | CTE[X1] (ppm/K) | Acoustic Velocity (m/s) |
| 0.0012 | 2 | 1 | 0.4 | 15 | >$10^{14}$ | 307 | 2.7 | 6200 |
| 0.0015 | 7 | 1 | 0.8 | 10 | >$10^{14}$ | 253 | 2.6 | 5700 |
| 0.0037 | 18 | 5 | 0.9 | 27 | >$10^{14}$ | 214 | 2.6 | 5100 |
| 0.0029 | 8 | 3 | 0.8 | 15 | >$10^{14}$ | 248 | 2.6 | 5700 |
| 0.0021 | 7 | 3 | 0.7 | 13 | >$10^{14}$ | 252 | 2.6 | 5700 |
| 0.0049 | 3 | 6 | 0.4 | 9 | >$10^{14}$ | 311 | 2.6 | 6100 |
| 0.0018 | 2 | 1 | 0.4 | 8 | >$10^{14}$ | 319 | 2.7 | 6200 |
| 0.0021 | 2 | 1 | 0.4 | 7 | >$10^{14}$ | 305 | 2.7 | 6100 |
| 0.0018 | 2 | 2 | 0.4 | 8 | >$10^{14}$ | 311 | 2.7 | 6200 |
| 0.0023 | 2 | 1 | 0.4 | 6 | >$10^{14}$ | 306 | 2.7 | 6100 |
| 0.0014 | 3 | 2 | 0.4 | 9 | >$10^{14}$ | 299 | 2.7 | 6100 |

[X1]Coefficient of thermal expansion (40° C. to 400° C.)

As shown in Table 2, the sintered sialon body of Experimental Example 1 had excellent properties. Specifically, the sintered sialon body of Experimental Example 1 had a bulk density of 3.160 g/cm³, an open porosity of 0.00%, and a relative density of 100.00%. In addition to sialon, minute amounts of alumina and silicon oxynitride were detected as crystal phases. The ratio (peak intensity ratio) Ix of the sum total of the intensities of maximum peaks of components other than sialon to the intensity of a maximum peak of sialon was very small, 0.0012. The number of pores having a maximum length of 0.5 μm or more in a 100 μm×100 μm area on a polished surface was very small, 1. For the surface flatness of the polished surface, it turned out that the center-line average roughness Ra was as small as 0.4 nm, and the level difference Pt between a maximum peak height and a maximum valley depth of a primary profile was as small as 15 nm. The Young's modulus was 307 GPa, the coefficient of thermal expansion (40° C. to 400° C.) was 2.7 ppm/K, and the acoustic velocity was 6200 m/s. The sintered sialon body of Experimental Example 1 had a resistivity of more than $10^{14}$ Ωcm and had high insulation properties.

(2) Experimental Examples 2 to 11

Sintered sialon bodies of Experimental Examples 2 to 11 were prepared by hot-press firing as in Experimental Example 1, except that the raw sialon powder A was replaced with the raw sialon powders B to K shown in Table 1. The properties of the sintered sialon bodies are shown in Table 2. The sintered sialon bodies all had excellent properties: open porosity, 0.01% or less; relative density, 99.9% or more; peak intensity ratio Ix relative to phases other than sialon, 0.005 or less; sialon average grain size, 20 μm or less; the number of pores, 10 or less; center-line average roughness Ra, 1.0 nm or less; level difference Pt between maximum peak height and maximum valley depth, 30 nm or less; Young's modulus, 210 GPa or more; CTE, 3.0 ppm/K or less; acoustic velocity, 5000 m/s or more. The sintered sialon bodies of Experimental Examples 2 to 11 all had a resistivity of more than $10^{14}$ Ωcm. It turned out that the sintered sialon bodies of Experimental Examples 4 to 11, each being a solid solution of magnesium oxide or yttrium oxide in sialon, all had properties comparable to those of the sintered sialon bodies of Experimental Examples 1 to 3.

3. Production and Evaluation of Composite Substrate

In Experimental Examples 12 to 22, composite substrates were obtained by directly joining LT substrates 100 mm in diameter and about 250 μm in thickness to supporting substrates 100 mm in diameter and about 230 μm in thickness cut out of the sintered bodies of Experimental Examples 1 to 11, respectively. Surfaces before joining were first activated. Specifically, after the pressure was reduced to the order of $10^{-6}$ Pa, the supporting substrate and the LT substrate were irradiated with a neutral atomic beam (acceleration voltage: 1 kV, current: 100 mA, Ar flow rate: 50 sccm) of argon for 120 sec using a FAB gun. After this, the substrates were bonded together and pressed under a joining load of 0.1 ton for 1 minute to directly join together the supporting substrate and the LT substrate at room temperature.

The composite substrates of Experimental Examples 12 to 22, in which supporting substrates having small Ra and Pt values were used, achieved successful joining; substantially no bubbles were observed at the joint interface between the supporting substrate and the LT substrate, and the area percentage (joining area percentage) of an actually joining portion of the joint interface was 92% or more as shown in Table 3. The joining area refers to the area where no bubbles are present, and the joining area percentage refers to the percentage of the joining area relative to the area of the entire joint interface. In addition, in the composite substrates of Experimental Examples 12 to 22 which achieved successful joining, the LT substrate was not peeled off when polished to a thickness of several micrometers to 20 μm, and the joining area was kept at 92% or more, confirming that the supporting substrate and the LT substrate were very firmly joined together. A section of the joint interface was observed with a transmission electron microscope (TEM). At the joint interface, there was no gap, firm joining was achieved also at an atomic level, and a very thin amorphous layer was present. Experimental Examples 7 to 9 were selected as representative examples, and the thickness of the amorphous layer was measured to be 3.6 nm, 3.8 nm, and 4.1 nm, respectively. The average of measurements at different three points of the amorphous layer was used as the thickness of the amorphous layer.

TABLE 3

| Experimental Example | Supporting Substrate | Functional Substrate | Joining Area Percentage of Composite Substrate |
| --- | --- | --- | --- |
| 12 | Experimental Example 1 | LT | 94 |
| 13 | Experimental Example 2 | LT | 92 |
| 14 | Experimental Example 3 | LT | 93 |
| 15 | Experimental Example 4 | LT | 93 |
| 16 | Experimental Example 5 | LT | 93 |
| 17 | Experimental Example 6 | LT | 93 |
| 18 | Experimental Example 7 | LT | 94 |
| 19 | Experimental Example 8 | LT | 95 |
| 20 | Experimental Example 9 | LT | 93 |
| 21 | Experimental Example 10 | LT | 94 |
| 22 | Experimental Example 11 | LT | 93 |

A silicon supporting substrate (Young's modulus: 190 GPa, coefficient of thermal expansion: about 4 ppm/K, resistivity: on the order of $10^4$ Ωcm) of the related art, as compared to the sialon supporting substrates, has a low Young's modulus and thus has little power to hold a functional substrate, has a high coefficient of thermal expansion and thus is likely to cause expansion and contraction of the functional substrate, and has a low resistivity and thus is likely to deteriorate resonance characteristics. An alumina supporting substrate (Young's modulus: 370 GPa, coefficient of thermal expansion: about 7 ppm/K) and a sapphire supporting substrate (Young's modulus: 490 GPa, coefficient of thermal expansion: about 7 ppm/K) of the related art each have a significantly high coefficient of thermal expansion at least twice those of the sialon supporting substrates and thus are likely to cause expansion and contraction of a functional substrate. Taken together, as compared to the silicon supporting substrate, the alumina supporting substrate, and the sapphire supporting substrate, the sialon supporting substrates of Experimental Examples are less likely to cause expansion and contraction and thus can provide surface acoustic wave devices with significantly improved frequency-temperature characteristics (TCF) and also excellent resonance characteristics. In particular, the sialon substrates used in Experimental Examples 1 and 6 are characterized by having a high Young's modulus and can more effectively improve TCF.

Experimental Examples 12 to 22 described above correspond to examples of the composite substrate of the present invention and the method for producing the composite substrate.

The present application claims priority to International Application No. PCT/JP2016/77628 filed on Sep. 20, 2016, the entire contents of which are incorporated herein by reference.

What is claimed is:

1. A composite substrate comprising a supporting substrate and a functional substrate that are directly joined together,
   the supporting substrate being a sintered sialon body,
   wherein an amorphous non-crystalline layer is disposed at an interface between the supporting substrate and the functional substrate, the amorphous non-crystalline layer having a thickness of 5 nm or less.

2. The composite substrate according to claim 1, wherein the functional substrate is a piezoelectric substrate.

3. The composite substrate according to claim 1, wherein the supporting substrate has an acoustic velocity of 5000 m/s or more.

4. The composite substrate according to claim 1, wherein the supporting substrate has a coefficient of thermal expansion at 40° C. to 400° C. of 3.0 ppm/K or less.

5. A method for producing the composite substrate according to claim 1, the method comprising:
   a joining step of joining together a surface of the supporting substrate and a surface of the functional substrate by direct joining,
   wherein, before the joining step, the surface of the supporting substrate is finished by polishing such that the number of pores present on the surface of the supporting substrate is 30 or less per 100 μm×100 μm area.

6. A method for producing the composite substrate according to claim 1, the method comprising:
   a joining step of joining together a surface of the supporting substrate and a surface of the functional substrate by direct joining,
   wherein, before the joining step, the surface of the supporting substrate is finished by polishing such that a center-line average roughness (Ra) of the surface of the supporting substrate in a 100 μm×140 μm measurement area is 1 nm or less.

7. A method for producing the composite substrate according to claim 1, the method comprising:
   a joining step of joining together a surface of the supporting substrate and a surface of the functional substrate by direct joining,
   wherein, before the joining step, the surface of the supporting substrate is finished by polishing such that a level difference (Pt) between a maximum peak height and a maximum valley depth of a primary profile of the surface of the supporting substrate in a 100 μm×140 μm measurement area is 30 nm or less.

8. An electronic device comprising the composite substrate according to claim 1.

\* \* \* \* \*